(12) United States Patent
Krause et al.

(10) Patent No.: US 12,009,634 B2
(45) Date of Patent: Jun. 11, 2024

(54) HEADER AND PACKAGE WITH INTEGRATED COOLER FOR ELECTRONIC COMPONENTS

(71) Applicant: SCHOTT AG, Mainz (DE)

(72) Inventors: Andreas Krause, Vilsheim (DE); Amy Soon Li Ping, Singapore (SG); Ong Wai Li, Johor Bahru (MY); Karsten Droegemüller, Eichenau (DE); Artit Aowudomsuk, Bangkok (TH)

(73) Assignee: Schott AG, Mainz (DE)

( * ) Notice: Subject to any disclaimer, the term of this patent is extended or adjusted under 35 U.S.C. 154(b) by 648 days.

(21) Appl. No.: 17/190,860

(22) Filed: Mar. 3, 2021

(65) Prior Publication Data
US 2021/0281042 A1   Sep. 9, 2021

(30) Foreign Application Priority Data

Mar. 4, 2020 (DE) ..................... 10 2020 105 772.5

(51) Int. Cl.
| | |
|---|---|
| *H01S 5/02315* | (2021.01) |
| *H01S 5/024* | (2006.01) |
| *H05K 1/02* | (2006.01) |
| *H05K 1/14* | (2006.01) |
| *H01R 12/52* | (2011.01) |

(52) U.S. Cl.
CPC ...... *H01S 5/02315* (2021.01); *H01S 5/02415* (2013.01); *H05K 1/025* (2013.01); *H05K 1/142* (2013.01); *H01R 12/52* (2013.01); *H05K 2201/09227* (2013.01)

(58) Field of Classification Search
CPC . H01S 5/02315; H01S 5/02415; H05K 1/025; H05K 1/142
See application file for complete search history.

(56) References Cited

U.S. PATENT DOCUMENTS

| | | | |
|---|---|---|---|
| 7,263,112 B2 | 8/2007 | Oomori et al. | |
| 9,159,634 B2 | 10/2015 | Hettler et al. | |
| 10,177,529 B2 * | 1/2019 | Hirayama | ............. H01S 5/0265 |

(Continued)

FOREIGN PATENT DOCUMENTS

| | | |
|---|---|---|
| DE | 10 2017 120 216 A1 | 3/2019 |
| WO | 2019/161755 A1 | 8/2019 |

*Primary Examiner* — Michael Carter
(74) *Attorney, Agent, or Firm* — Taylor IP, P.C.

(57) ABSTRACT

A header for an electronic component including a base body, a thermoelectric cooler, a carrier and first and second conductor track arrangements. The thermoelectric cooler is thermally attached to the base body. The carrier is coupled to the thermoelectric cooler and is cooled thereby. The first and second conductor track arrangements each have a signal conductor, at least one grounding conductor and an end. The second conductor track arrangement is on the carrier and connected to the electronic component. The first and second conductor track arrangements are separated by a gap that is bridged by bonding wire connections electrically connecting the first and second signal conductors and electrically connecting the two grounding conductors, the ends facing each other across the gap, at least one of the ends having a capacitive structural feature that increases the capacitance of the first and/or the second conductor track arrangement.

11 Claims, 7 Drawing Sheets

(56) References Cited

U.S. PATENT DOCUMENTS

| | | | |
|---|---|---|---|
| 2012/0045161 A1* | 2/2012 | Okada | H01S 5/02345 385/1 |
| 2015/0340841 A1 | 11/2015 | Joseph | |
| 2018/0284374 A1 | 10/2018 | Wang | |
| 2020/0067265 A1 | 2/2020 | Hettler et al. | |

* cited by examiner

HEADER AND PACKAGE WITH INTEGRATED COOLER FOR ELECTRONIC COMPONENTS

CROSS REFERENCE TO RELATED APPLICATIONS

This application claims priority to German Patent Application No. DE 10 2020 105 772.5 filed on Mar. 4, 2020, which is incorporated in its entirety herein by reference.

BACKGROUND OF THE INVENTION

1. Field of the Invention

The present invention relates to packages for electronic components. More particularly, the invention relates to a header for a package for electronic components that includes an integrated cooler having improved transmission properties.

2. Description of the Related Art

A common type of package for an electronic component is known as a Transistor Outline (TO) package. A package of this type, which is designed for radio frequency transfer, is described in DE 10 2017 120 216 A1.

Further packages for high transfer rates are disclosed in WO 2019/161755 A1, US 2018/284374 A1, and U.S. Pat. No. 10,177,529 B2.

For some optoelectronic applications such as the aforementioned radio frequency data transfer, it is desired to precisely control the wavelength of the laser chips used for the transfer. Since the laser wavelength is temperature dependent, the temperature of the laser should therefore be stabilized within a narrow range. To achieve this, a thermoelectric cooler (TEC) can be used. For particularly effective cooling, such a cooler can be integrated into the electronic component package such as a TO package. A common problem when using a thermoelectric cooler is to achieve good temperature insulation on the cold side which comprises the electronic device, while at the same time having low signal reflection at the connection points. In the case of TO type packages, the problem of a suitable design is exacerbated due to the limited space available.

SUMMARY OF THE INVENTION

The present invention is intended to be particularly useful for radio frequency data transfer components. More particularly, data transfer rates of about 50 Gbit/s and more are intended.

The present invention is therefore based on the object of providing a header and an electronic component including such a header, which provides for improved cooling and radio frequency transmission. This object is achieved by the subject-matter of the independent claims. Advantageous embodiments are specified in the dependent claims.

Hitherto, as described in DE 10 2017 120 216 B4, for example, simple bonding wire connections have been used to electrically connect the electronic device in the package. For the next generation of optical data links, the data transfer rate is intended to be doubled to 56 GBit/s. In this case, simple bonding wire connections would cause considerable conduction losses. To overcome this problem, the present disclosure provides compensation using a C-L-C network. At the same time, it achieves good thermal decoupling of the hot and cold sides of a TEC inside the package.

For this purpose, a header for an electronic component is provided, which includes a base body that has a plurality of electrical feedthroughs, the feedthroughs each have an opening that is sealed by insulation material through which at least one feedthrough conductor extends so as to be electrically insulated from the base body, and wherein
  a thermoelectric cooler is attached to the base body in such a manner that the thermoelectric cooler is able to give off its waste heat generated during operation to the base body, and wherein
  a carrier for an electronic device is attached to the thermoelectric cooler so that the carrier can be cooled by the thermoelectric cooler, and wherein a first conductor track arrangement is provided, with a first signal conductor that is connected to a feedthrough conductor, and at least one grounding conductor, and a second conductor track arrangement. The second conductor track arrangement is on the carrier for connecting the electronic device. The second conductor track arrangement has a second signal conductor and at least one grounding conductor, wherein the two conductor track arrangements are separated by a gap. The gap is bridged by bonding wire connections connecting the two signal conductors and the grounding conductors, and wherein at least one of the ends of the conductor track arrangements are facing each other at the gap include a capacitive structural feature that increases the capacitance of the conductor track arrangement. Preferably, both ends of the conductor track arrangements include such capacitance-increasing structural features. Most preferably, in this case, the capacitances of the structural features are identical in order to obtain a symmetrical circuit.

The gap is useful to interrupt heat flow from the hot side of the thermoelectric cooler, i.e. from the base body, to the cold side. The bonding wire connections exhibit high inductance, which would cause reflections on the signal line and correspondingly high losses. However, the capacity-increasing structural features at the end of the conductor track arrangements create a C-L-C network, that is to say a structure having two capacitive elements in addition to the inductance of the bonding wire connection. This C-L-C network can be used to achieve impedance matching which, ideally, completely compensates for the high impedance of the bonding wire connection.

In a preferred embodiment of the present invention, at least one of the conductor track arrangements is configured as a coplanar waveguide. Preferably, both conductor track arrangements are coplanar waveguides. In a coplanar waveguide arrangement, at least one conductor track of the grounding conductor extends on the same plane next to the conductor track of the signal conductor.

The gap with the bridging bonding wire connections reduces the heat flow from the side of the first conductor track arrangement to the electronic device. This thermal decoupling is even considerably enhanced if the header has a pedestal on which the first conductor track arrangement is disposed, and the pedestal is separated from the carrier for the electronic device by the gap.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
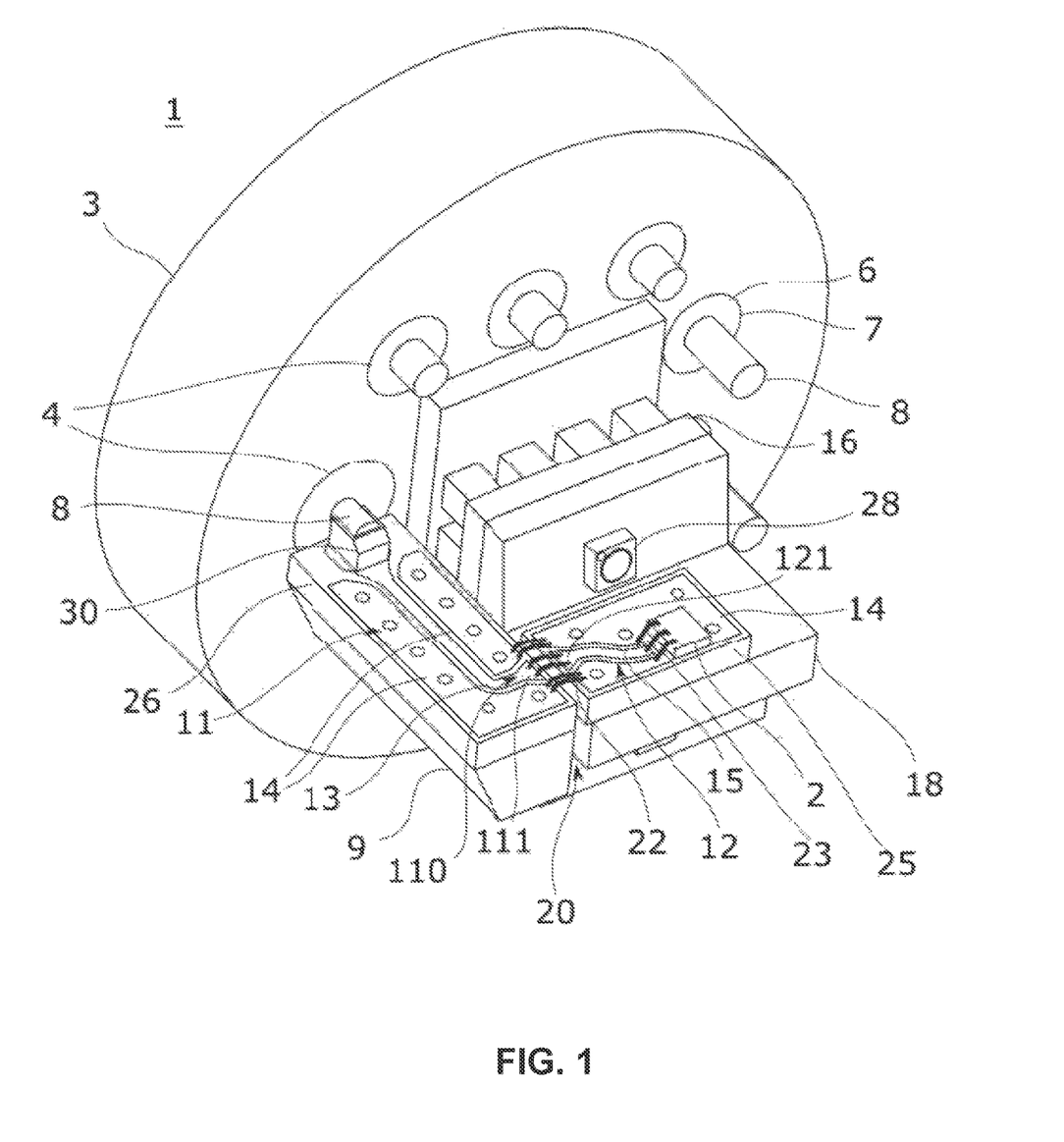
FIG. 1 is a perspective view of an embodiment of a header of the present invention.
Figure 2:
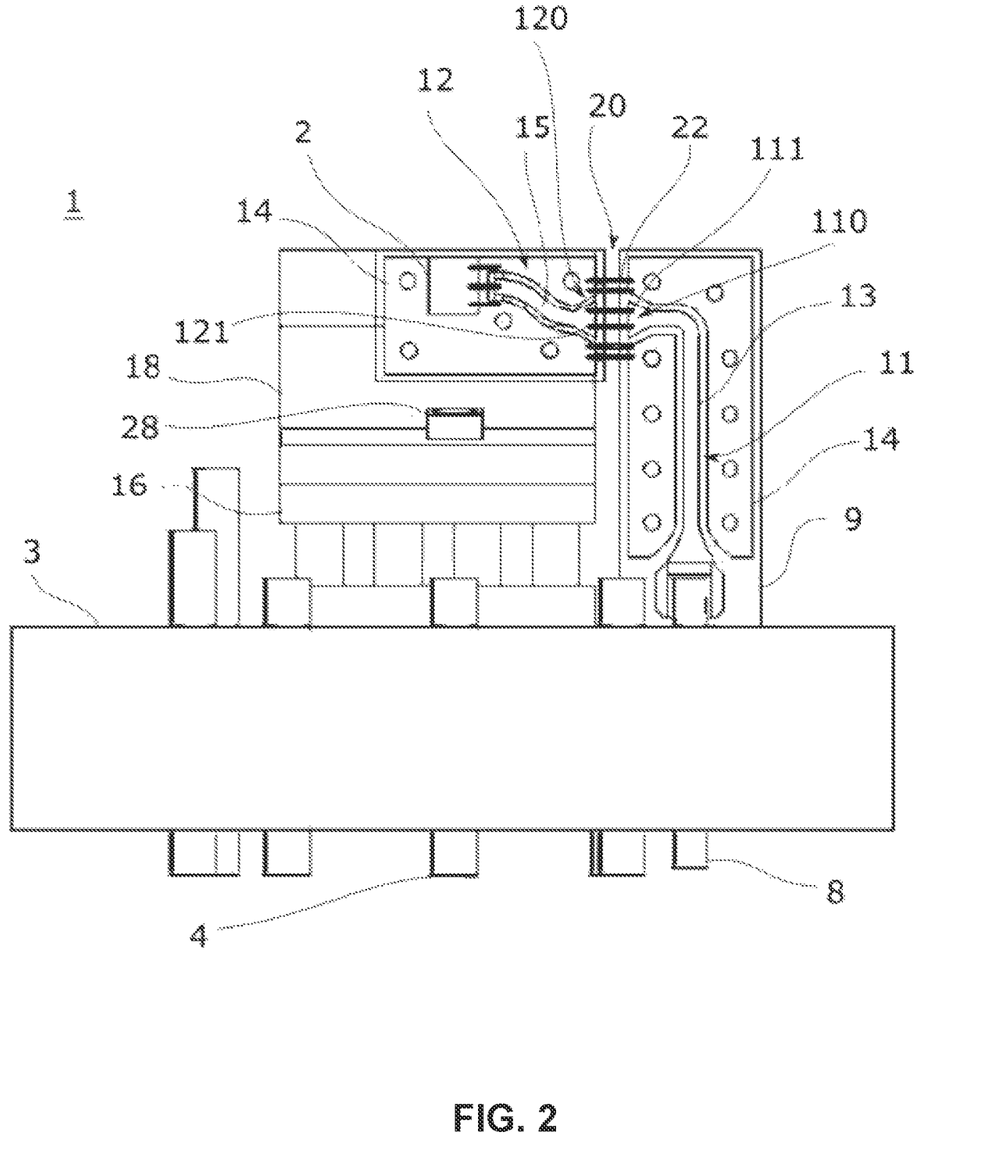
FIG. 2 is an elevational view of the header of FIG. 1.

Exemplary embodiments provided according to the present invention are illustrated by way of an example of a header 1 according to the present disclosure shown in FIGS. 1 and 2. Header 1, which forms part of an electronic component package, includes a base body 3 that has a plurality of electrical feedthroughs 4. In a preferred embodiment of the present invention, and without being limited to the illustrated example, base body 3 has a disk-like or a flange-like shape.

Feedthroughs 4 each have an opening 7 sealed by an insulation material 6 through which at least one feedthrough conductor 8 extends in a manner so as to be electrically insulated from the base body 3. Insulation material 6 in particular is a glass seal 6. Glass seals 6 can simply be produced by a melting of the glass. However, insulation material 6 may also be a ceramic insulation, a glass ceramic material, or a plastic material.

For electronic components intended for data transfer at high data rates, temperature stabilization or cooling is often desirable. For this purpose, header 1 includes a thermoelectric cooler 16 attached to base body 3. Thermoelectric cooler 16 is connected such that the hot side is coupled with base body 3, with waste heat generated during operation being transferred to base body 3. A carrier 18 for an electronic device 2 is mounted to thermoelectric cooler 16 on the cold side thereof, so that carrier 18 is cooled by thermoelectric cooler 16. A problem with such an arrangement is that the waste heat might flow back to electronic device 2 by way of base body 3. In particular, heat flow may occur along the path of the electrical feed line. However, thermal decoupling measures such as long meandering conductive paths might significantly increase conduction losses.

Here, header 1 is configured such that this heat flow is minimized while having low signal line losses at the same time. For this purpose, a first conductor track arrangement 11 has a first signal conductor 13 which is connected to a feedthrough conductor 8, and at least one grounding conductor 14. A second conductor track arrangement 12, for connecting the electronic device, is provided on carrier 18, Second conductor track arrangement 12 includes a second signal conductor 15 and at least one grounding conductor 14. The two conductor track arrangements 11, 12 are separated by a gap 20, and gap 20 is bridged by bonding wire connections 22. Accordingly, the two signal conductors 13, 15 are electrically connected by at least one bonding wire connection 22, and the grounding conductors 14 are electrically connected by at least one further bonding wire connection 22. Gap 20 provides good thermal separation. However, the bonding wire connections are problematic, since they have an increased inductance. This can cause reflections at the contact points of the bonding wires. In order to avoid this, capacitive structural features 111, 121 are provided at the ends 110, 120 opposing or facing each other across the gap. These structural features are designed or shaped so as to increase the capacitance of the conductor track arrangements 11, 12, in particular the capacitance per unit length of the line. The two capacitive structural features cooperate with bonding wire connection 22 connecting the two signal conductors 13, 15 to define a C-L-C network. The impedance thereof can be adjusted such that reflections at the gap 20 are mitigated or, ideally, even completely avoided.

In one embodiment of the present invention electronic device 2 is not directly mounted on carrier 18, but rather device 2 is mounted on a submount 25. Submount 25 is a support for device 2 and furthermore, has second conductor track arrangement 12 disposed thereon. In this way, electronic device 2 can be preassembled on submount 25 and connected to conductor track arrangement 12. Then, submount 25 with electronic device 2 can be aligned and mounted on carrier 18. The connection of electronic device 2 can be accomplished by a bonding wire connection 23, like the bridging of gap 20.

Submount 25 may be made of aluminum nitride ceramic, for example, or more generally of a ceramic containing aluminum nitride. Other ceramic materials with good thermal conductivity can be used as well.

The signal path of header 1 for transferring the radio frequency signals (also referred to as RF signals below) starts on feedthrough conductor 8 outside the package and ends on electronic device 2. As can be seen from FIGS. 1 and 2, a rather long section of the signal path extends next to thermoelectric cooler 16 and carrier 18. In order to route the signals to electronic device 2, header 1 includes a pedestal 9 on which first conductor track arrangement 11 is disposed. Pedestal 9 is separated from carrier 18 for electronic device 2 by gap 20. Pedestal 9 enables simple assembly since it provides a solid support for first conductor track arrangement 11, due to its mechanical stability, and thus facilitates the establishing of bonding wire connections 22. Moreover, pedestal 9 can serve as a robust grounding contact for first conductor track arrangement 11. On the other hand, a drawback of pedestal 9 is that it makes good thermal contact with base body 3. However, the heat flow to electronic device 2 is interrupted by gap 20. Pedestal 9 may be an integral part of base body 3, or else it may be mounted to base body 3 as a separate part, for example, soldered thereto.

In one embodiment of the present invention, first conductor track arrangement 11 is disposed on a circuit board 26. Circuit board 26 can then be mounted to pedestal 9, for example, by a solder connection. Circuit board 26 is preferably made of a ceramic material, for example a ceramic containing aluminum nitride or aluminum oxide. Signal conductor 13 is soldered to feedthrough conductor 8 of a feedthrough 4 to be electrically connected thereto. Grounding conductor(s) 14 can simply be electrically connected through pedestal 9.

Figure 3:
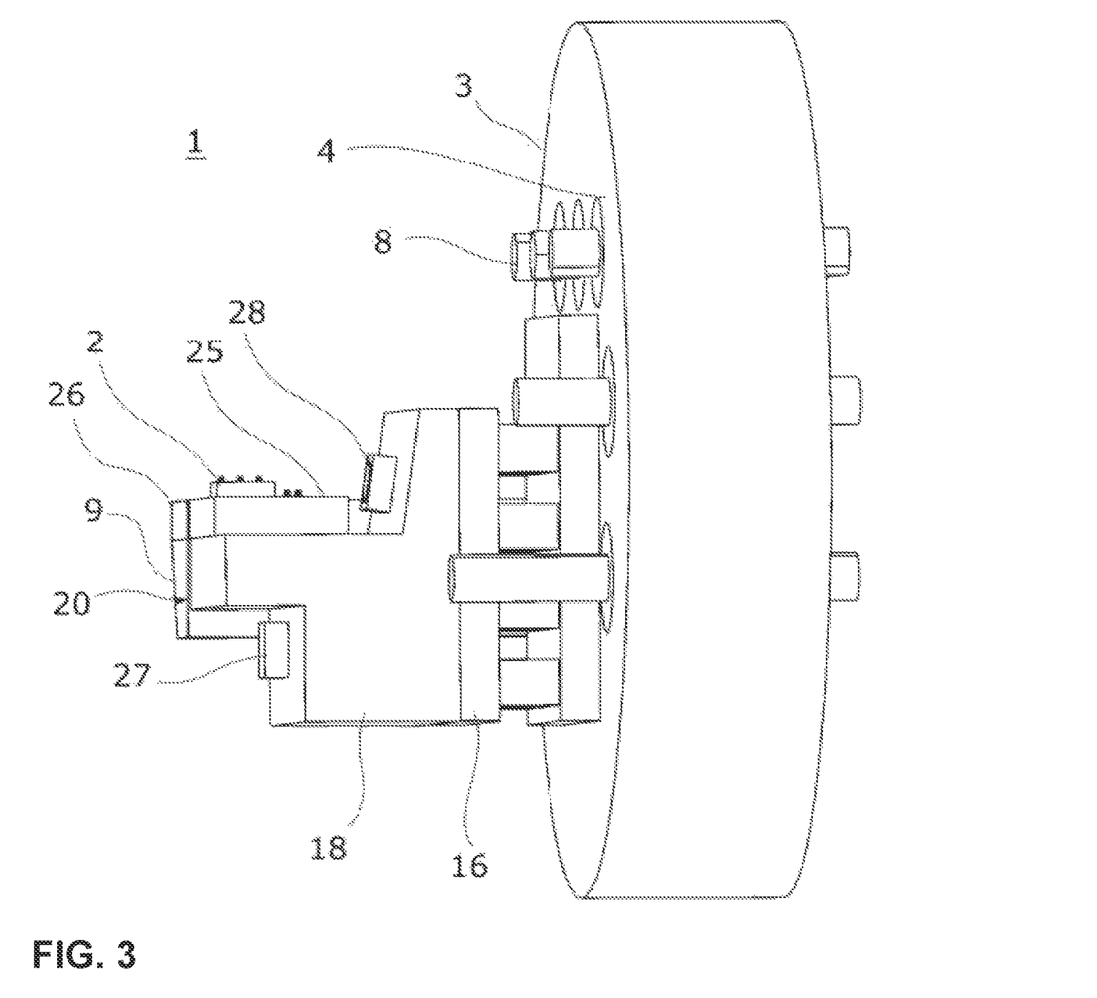
FIG. 3 illustrates a perspective side view of the header of FIGS. 1 and 2.

The output power of thermoelectric cooler 16 is feedback controlled using a temperature measurement in order to achieve a consistent temperature of electronic device 2. For this purpose, a temperature sensor 27 may be arranged on carrier 18, as can be seen in the view of FIG. 3. The measured values of temperature sensor 27 may be read out by way of one of feedthroughs 4 and processed in an external control circuit for controlling the temperature of electronic device 2. A thermistor 27 would be a suitable temperature sensor 27, for example.

For high data transfer rates, an electro-optical converter in the form of a laser diode is particularly suitable. Such a laser diode may be a directly modulated laser diode or an externally modulated laser diode (EML). An externally modulated laser diode is preferred. To maintain wavelength stability, it is advantageous to cool the laser diode. Thus, the header of the present invention described herein is therefore particularly suitable for laser diodes, in particular also for externally modulated laser diodes as electronic device 2. What is furthermore advantageous for avoiding signal attenuation due to reflections and for high transfer rates is a signal path grounded on one end, i.e. an asymmetrical signal path with an impedance $Z_0$ of 50 ohms. In the case of the header presently described, the signal path includes first and second waveguide arrangements 11, 12, and the bridging of gap 20 by way of bonding wire connections 22.

Figure 4:
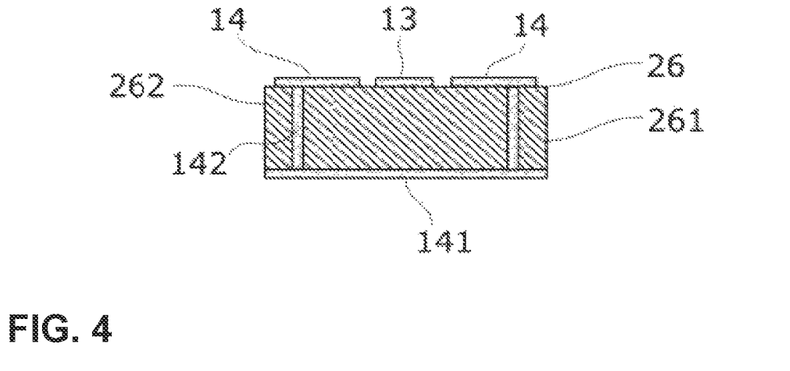
FIG. 4 shows a cross-sectional view of a printed circuit board having a first conductor track arrangement.

Now additionally referring to FIG. 4 there is shown an exemplary embodiment of circuit board 26 in a cross-sectional view. On one side of printed circuit board 26, grounding conductors 14 and signal conductor 13 can be seen, which can also be seen in FIGS. 1 and 2. The opposite side of printed circuit board 26 is provided with a metallic layer which is used as a back-side electrode 141. Header 1 and, more generally, also the package including header 1 is grounded and therefore forms part of the return line of the radio frequency signal. Therefore, metallic pedestal 9 connected to base body 3 is also grounded. Circuit board 26 is connected to pedestal 9 through back-side contact 141. For example, circuit board 26 may be soldered to pedestal 9. Grounding conductors 14 are connected to back-side electrode 141 through conductive vias 142. When circuit board 26 with back-side electrode 141 is placed on pedestal 9, back-side electrode 141 is grounded through pedestal 9 that is connected to base body 3. By connecting grounding conductors 14 through vias 142, grounding conductors 14 are kept at ground potential as well. Without being limited to the specific exemplary embodiment of FIG. 4, it is contemplated, according to another embodiment, that back-side electrode 141, in the form of a conductive layer, is disposed on a side of circuit board 26 opposite first conductor track arrangement 11, and that the at least one grounding conductor 14 of conductor track arrangement 11 is connected to back-side electrode 141 through at least one, preferably a plurality of conductive connections, that is vias 142. According to a further embodiment, the at least one grounding conductor 14 is electrically connected to pedestal 9 as described above.

As can furthermore be seen from FIGS. 1, 2, and 4, conductor track arrangements 11, 12 are in the form of coplanar waveguides. A coplanar waveguide includes a signal conductor 13, and two grounding conductors 14 extending in the same plane next to the respective signal conductor 13, 15. Due to back-side contact 141 shown in the embodiment illustrated in FIG. 4, the conductor track arrangement specifically has the form of a conductor-backed coplanar waveguide (CBCPW). Submount 25 with second conductor track arrangement 12 can be configured similarly as shown in FIG. 4, so that conductor track arrangement 12 defines a CBCPW.

Feedthrough conductor 8 of feedthrough 4 for introducing the radio frequency signal is connected to signal conductor 13 of conductor track arrangement 11 by a solder connection 30, as can be seen in FIG. 1.

As can also be seen from FIGS. 1 and 2, signal conductor 13 of the conductor track arrangement changes its course from a direction collinear with feedthrough conductor 8 connected to signal conductor 13 to a direction towards electronic device 2. Preferably, signal conductor 13 changes its direction by at least 45°, more particularly by 90°, as illustrated. Signal conductor 13 terminates near the side edge of circuit board 26, at gap 20. Accordingly, circuit board 26 has two opposite end edges and, adjoining thereto, two opposite side edges, with one of the end edges facing main body 3, and the gap being defined along one of the side edges. Side edges 261, 262 are indicated in FIG. 4.

Bonding wire connections 22 bridging gap 20 and connecting two conductor track arrangements 11 and 12 are used in spite of their comparatively high inductance per unit length, since they represent connections of low thermal conductivity and thus provide good thermal separation between the hot and cold sides of thermoelectric cooler 16.

Gap 20 has a width of preferably at least 0.1 mm. This moreover leaves enough space for manufacturing and assembly tolerances. Furthermore, according to a further embodiment of the present invention, the conductor tracks of signal conductors 13, 15 and preferably also of grounding conductors 14 do not terminate directly flush with the edges of printed circuit board 26 and submount 25, but are set back somewhat. The offset preferably amounts to between 0.02 mm and 0.1 mm. By way of example, conductor tracks 13, 14, 15 may be set back from the edge of submount 25 or of circuit board 26 by 0.05 mm. With these dimensions, the spacing between the opposing conductor tracks of the two conductor track arrangements 11, 12 to be connected by bonding wires 22 is at least 0.12 mm, typically about 0.2 mm. As a consequence thereof, bonding wires 22 have a length of at least 0.2 mm, typically about 0.3 mm.

Figure 5:
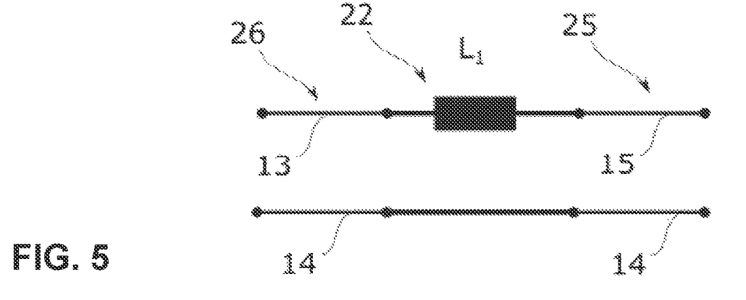
FIG. 5 is a circuit diagram for bonding wire connections for the header of FIGS. 1-3.

However, in the case of high frequencies of the signals traveling signal conductors 13, 15, there will still be inductive discontinuities which leads to impedance mismatches and thus to undesired reflections. To illustrate this, FIG. 5 shows an equivalent circuit diagram of a bonding wire connection 22 comprising two conductor track arrangements in the form of coplanar waveguides including signal conductors 13, 15 and grounding conductors 14. The two waveguides on submount 25 and on circuit board 26 have an impedance $Z_0$ of preferably 50 ohms. The bonding wire connection 22 creates an additional inductance $L_1$ and accordingly increases the impedance.

Figure 6:
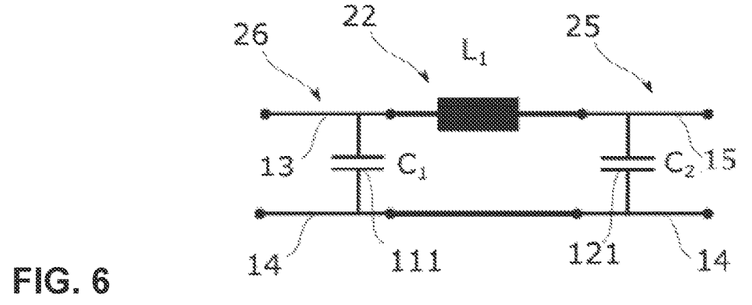
FIG. 6 illustrates another circuit diagram for bonding wire connections for the header of FIGS. 1-3.

The next generation of optical data links is intended to work at data rates of 56 GBaud. At these data rates, the increased impedance of bonding wires 22 represents a serious problem. In order to reduce the high impedance of the bonding wire connection, a C-L-C compensation configuration is utilized. The C-L-C compensation configuration includes a capacitance C1 connected in parallel, a series-connected inductance L1, and a second capacitance C2 connected in parallel. A corresponding equivalent circuit diagram is shown in FIG. 6. The inductance L1 and the two capacitances C1, C2 cooperate as an equivalent circuit diagram of a transmission line, as long as their structural sizes are small compared to the wavelength of the signal to be transferred. For example, the wavelength of a 50 GHz signal in air is 6 millimeters. The size of the C-L-C network can be assumed to be small if it is smaller than $^{1}\!/_{10}$ of the signal wavelength. Accordingly, the calculation indicates that the sizes would be of not more than 0.6 mm in the above example.

The impedance $Z_{CLC}$ of the C-L-C network can be calculated as $$Z_{CLC} = \sqrt{\frac{L1}{C1+C2}}.$$

With a given inductance L1 of bonding wires 22, the impedance $Z_{CLC}$ is determined by the capacitances C1 and C2. The capacitances may be identical or different. Identical capacitances are preferred in order to have a symmetrical network. If the impedance $Z_{CLC}$ is equal to the impedance $Z_0$ of the two waveguides, impedance matching is achieved. In this case, the signal will not be attenuated by reflections. The additional capacitances C1, C2 are provided by capacitive structural features 111, 121. From the above formula it can be seen that a desired impedance $Z_{CLC}$ can also be achieved if only one capacitive structural feature is provided, so that one of the capacitances C1, C2 is equal to zero. Also, the two capacitances C1, C2 need not be of the same magnitude. However, the case of identical or at least approximately identical capacitances C1, C2 is preferred in order to obtain a symmetrical C-L-C network. Therefore, according to a preferred embodiment of the present invention, both ends 110, 120 of conductor track arrangements 11, 12 have capacitive structural features 111, 121. The capacitances thereof are preferably identical or at least of the same order of magnitude, so that a ratio of the capacitances has a value ranging from 0.5 to 2.

In one embodiment of the present invention, where both ends of conductor track arrangements 11, 12 have capacitive structural features 111, 121 so that a C-L-C-network may be attributed as an equivalent circuit. Capacitive structural features 111, 121 are preferably designed and adapted to the inductance of bonding wire connection 22 so that the ratio L1/C1+C2 has a value in a range from 1000 Ohm² to 5000 Ohm², preferably in a range from 1225 Ohm² to 4225 Ohm². In this ratio C1 and C2 denote the capacitances of the capacitive structural features 111, 121 and L1 denotes the inductance of bonding wire connection 22. In the case of more than one bonding wire connection 22, accordingly, L1 denotes the overall inductance of all bonding wire connections which connect signal conductors 13, 15. The aforementioned values of 1000 Ohm² to 5000 Ohm², preferably 1225 Ohm² to 4225 Ohm² are also valid if only one of signal conductors 13 or 14 has a capacitive structural feature 111, or 121, respectively. In this case, either C1 or C2 equals zero and the values are met by the relation L1/C, with C being the capacitance of the single capacitive structural feature 111 or 121.

Generally, without restriction to specific embodiments it is preferred that the impedance of the arrangement including the at least one capacitive structural feature and bonding wire connection 22, preferably of the C-L-C network with the bonding wire connection connecting the two capacitive structural features 111, 121 is in a range from 20 Ohm to 80 Ohm. Preferably, the impedance is in range of from 35 Ohm to 65 Ohm.

According to a further embodiment, gap 20 is bridged with a multitude of parallel connected bonding wire connections 22 contacting signal conductor 13. The parallel connected bonding wire connections 22 as exemplarily shown in FIGS. 1 and 2, not only reduce the resistance but also have a lower inductance compared to a single wire. Preferably a twofold bonding wire connection 22 is employed to bridge gap 20. The one or more bonding wire connections are preferably designed to have an inductance in a range from 50 pH to 800 pH. Particular preferred is an inductance in the range from 100 pH to 600 pH. The inductance L of a single bonding wire connection 22 may be estimated using the relation L=lBond·1nH/mm. Therein, lBond denotes the length of the bonding wire. In the case of a twofold bonding wire connection, i.e. with two bonding wires 22 connected in parallel, the inductance is halved.

The length of bonding wires 22 preferably is within a range from 0.25 mm to 0.75 mm, particularly preferable in a range from 0.3 mm to 0.6 mm. These lengths and/or inductances are especially useful to enable a sufficient gap width on the one hand and a good compensation with one or two capacitive structural features.

Figure 7:
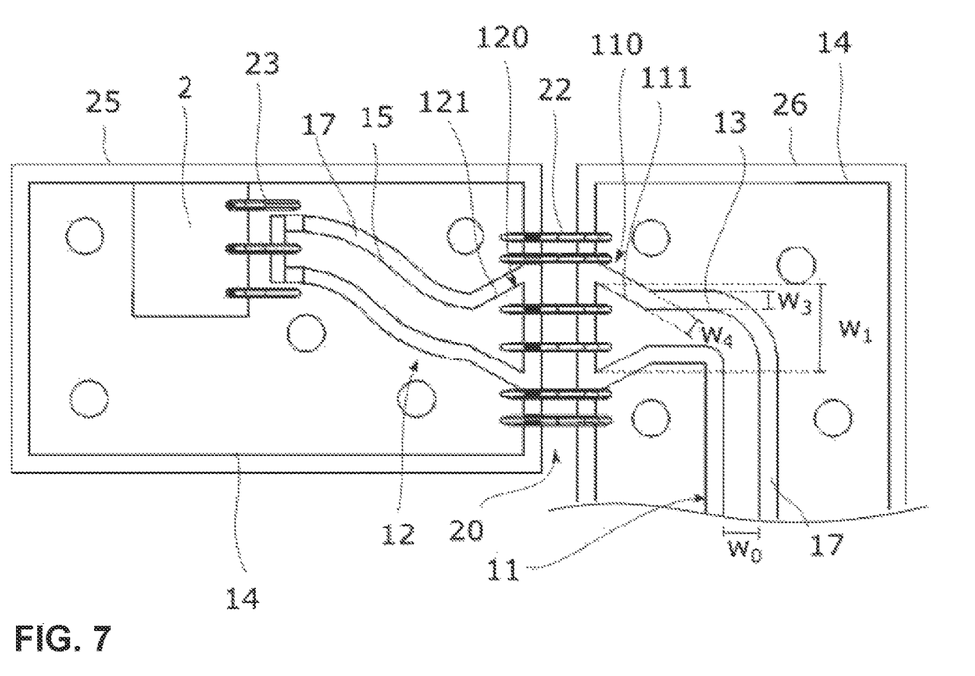
FIG. 7 shows an enlarged detail view of a submount and a printed circuit board including their conductor track arrangements for use on the header of FIGS. 1-3.

Now additionally referring to FIG. 7, there is shown an enlarged detail of submount 25 and printed circuit board 26 including their conductor track arrangements 11, 12. FIG. 7 illustrates one exemplary embodiment of the preferred implementation of a capacitive structural feature 111, 121, which comprises an enlarged portion of the signal conductor 13, 15 at the ends 110, 120 of conductor track arrangements 11, 12. In a preferred refinement, the enlarged portion is trapezoidal, as illustrated. As shown, signal conductor 13, 15 widens from a width $w_0$ to a width $w_1$. Without being limited to the illustrated example, regardless of whether the enlarged portion has a trapezoidal or other shape, it is contemplated that signal conductor 13, 15 widens by at least a factor of 1.5. According to one example, signal conductor 13, 15 widens from a width of 0.1 mm to a width of 0.2 mm, that is to say by a factor of 2, according to yet another example to a width of 0.3 mm, i.e. by a factor of 3. In order to achieve an effective increase in capacitance it is contemplated that the spacing between signal conductor 13, 15 and the at least one grounding conductor 14, as measured in the direction perpendicular to the longitudinal extension of signal conductor 13, 15, remains substantially constant. This embodiment is also implemented in the example illustrated in FIG. 7. The width $w_3$ of spacing 17 remains constant, since grounding conductors 14 recede in a direction perpendicular to the longitudinal extension of signal conductor 13, 15 to the same extent as signal conductor 13, 15 widens. Without being limited to the illustrated example, it is contemplated that the width of the spacing 17 between grounding conductor 14 and signal conductor 13, 15 changes by no more than 1.5 in the vicinity of the enlarged portion, the width being measured perpendicular to the longitudinal extension of signal conductor 13, 15. According to yet another embodiment, the spacing between grounding conductor 14 and signal conductor 13 and/or 15 may be reduced in order to serve as a capacitive structural feature 111, 121 or form part of capacitive structural feature 111, 121. In the example of FIG. 7, the spacing $w_4$ would be smaller than the spacing w 3 in this case. Without being limited to the illustrated example, it is therefore contemplated that the capacitive structural feature 111, 121 includes a reduced spacing $w_4$ between grounding conductor 14 and signal conductor 13, 15 at end 110 or 120 of conductor track arrangement 11, 12.

By well dimensioning the capacitive structural features 111, 121 which are preferably in the form of trapezoidal enlarged portions, it is possible to fully compensate the high impedance of bonding wire connections 22. Below, FEM-EM field simulations conducted for the header 1 will demonstrate that such compensation is possible.

Three models were simulated in a frequency range up to 55 GHz. In model 1, the signal conductor does not terminate in an enlarged portion and therefore represents a coplanar waveguide without compensation for the inductance L1 of the bonding wire connections. The signal conductor has a width of 0.1 mm. In model 2, a moderate trapezoidal enlarged portion is provided in a form so that both signal conductors 13, 15 widen from a width of 0.1 mm to a width of 0.2 mm, i.e. by a factor of 2. In the otherwise identical model 3, signal conductors 13, 15 widen to a width of 0.3 mm, i.e. by a factor of 3.

The FEM simulation obtains scattering parameters as a result. Parameter S21 is the forward transmission factor, and parameter S11 is the input reflection factor. The position of the feedthrough conductor on the surface of the insulation material outside of header 1, i.e. on the side of header 1 opposite conductor track arrangements 11, 12, is assumed as gate 1 of the simulation. Gate 2 is at the end of conductor track arrangement 12, where electronic device 2 is connected.

Figure 8:
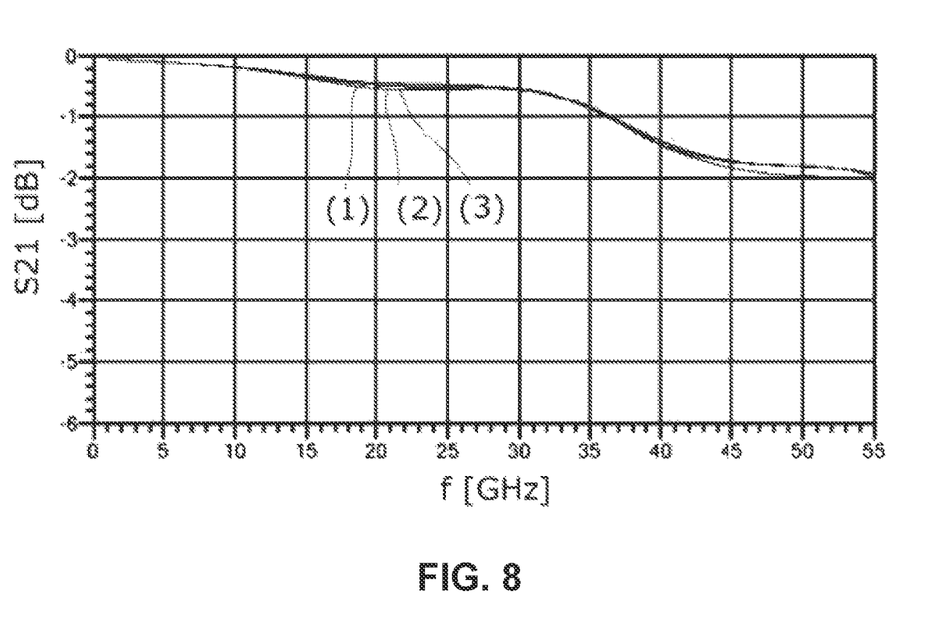
FIG. 8 is a graph of the forward transmission factor as a function of frequency.
Figure 9:
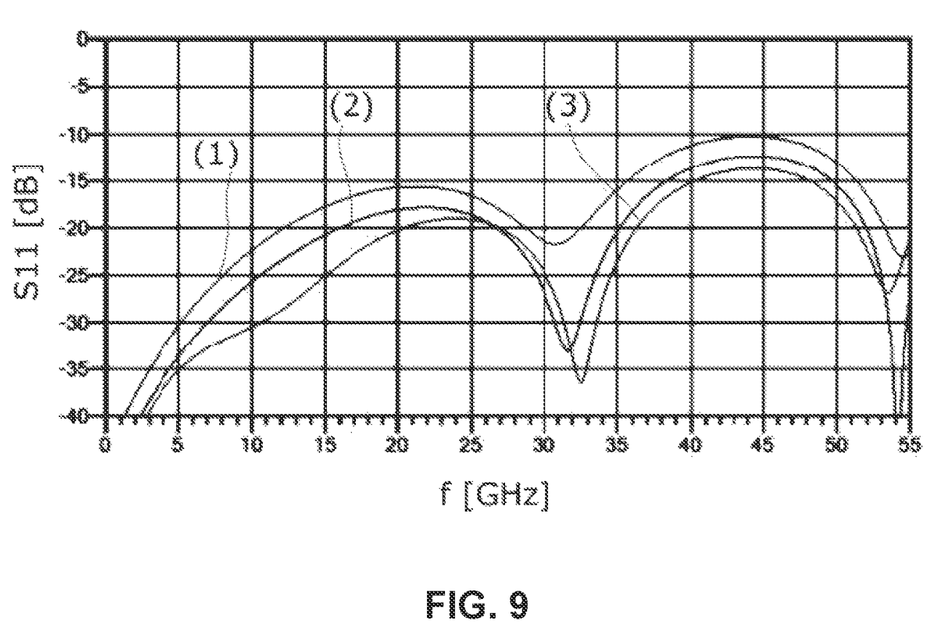
FIG. 9 is a graph of the input reflection factor as a function of frequency.

FIG. 8 shows a plot of forward transmission factors S21 as a function of frequency for the models mentioned above. FIG. 9 illustrates a corresponding plot of the input reflection factors S11. Curves (1), (2), (3) represent the respective simulation values of models 1, 2, and 3.

Forward transmission factor S21 is barely influenced by the presence and size of the capacitive structural features. The curves in FIG. 8 are almost exactly overlapping. On the other hand, a clear influence is found on the input reflection factor S11. Reflection attenuation is from 5 to 10 dB less for models 2 and 3 than that of model 1, i.e. with conductor track arrangements not having the capacitive structural features.

Figure 10:
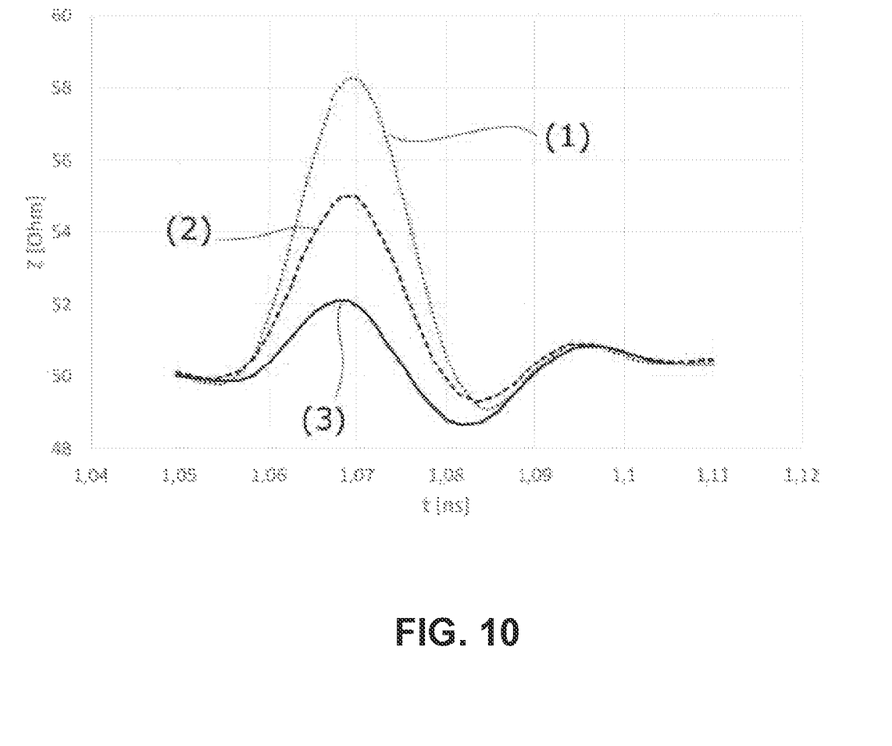
FIG. 10 shows TDR plots of impedance as a function of time for three different models.

FIG. 10 shows Time-Domain Reflectometry (TDR) plots of impedance as a function of time for the three different models. The plots represent the impedance of the signal path as a function of transit time of the RF signal. The time is therefore a measure of the longitudinal position along the signal path.

A peak appears starting at a time of about 1.055 nanoseconds. This peak clearly depends on the model, i.e. on the size of the trapezoids as the capacitive structural features 111, 121. Model 1 or curve (1) shows the highest impedance value of 58 ohms. Model 2 with moderately sized trapezoids shows a lower impedance of 55 ohms. The lowest impedance of 52 ohms is achieved with model 3, i.e. with trapezoids in which the conductor tracks widen from a width of 0.1 mm to a width of 0.3 mm at gap 20. This model also exhibits the lowest overall return loss (FIG. 9). More generally, the plots of FIG. 10 show that the capacitive structural features 111, 121 can be designed such that the impedance of a line designed with an impedance of 50 ohms does not rise above 55 ohms in the area between capacitive structural features 111, 121. In both models that include capacitive structural features, however, the increase in impedance is in particular lower compared to curve (1). According to a further embodiment it is contemplated that the impedance increases by less than 5 ohms in the area between capacitive structural features 111, 121.

The simulation results showed that the here proposed C-L-C compensation network can counteract the negative effects of a bonding wire connection and that impedance matching is possible for the connection. The compensation is also effective up to data transfer rates of at least 55 GHz. Therefore, a header 1 as described herein is particularly suitable for high-speed applications such as optical transmission at 56 GBaud.

Figure 11:
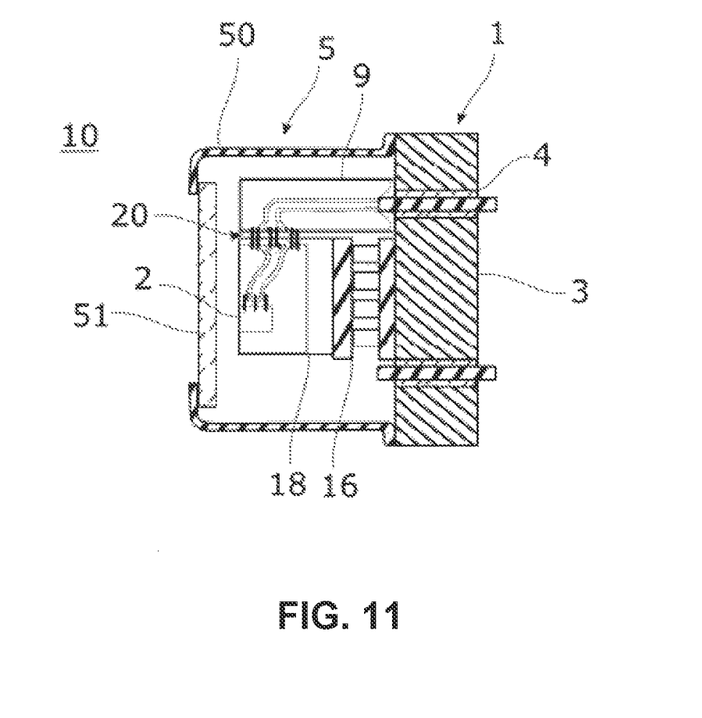
FIG. 11 shows a sectional view of an electronic component of the present invention.

Header 1 alone, even when equipped with an electronic device 2, such as an EML diode, typically does not yet represent a complete electronic component, since a sealed package enclosing the electronic device is usually provided for this purpose. Therefore, according to a further aspect, an electronic component 10 is provided, which includes a package 5 and a header 1 as described above. Such an electronic component 10 is shown in FIG. 11 in a schematic sectional view. Package 5 is partly defined by header 1, namely in particular by its base body 3. Further package constituents such as a cap 50 including a window 51 can be joined to base body 3. Preferably, cap 50 with window 51 hermetically encloses electronic device 2 on carrier 18. An electronic device 2 in the form of an optoelectronic transmitter such as an EML diode, or else in the form of an optoelectronic receiver, is thus able to transmit or receive signals through window 51. Cap 50 can be joined to header 1 by welding or soldering, for example.

Figure 12:
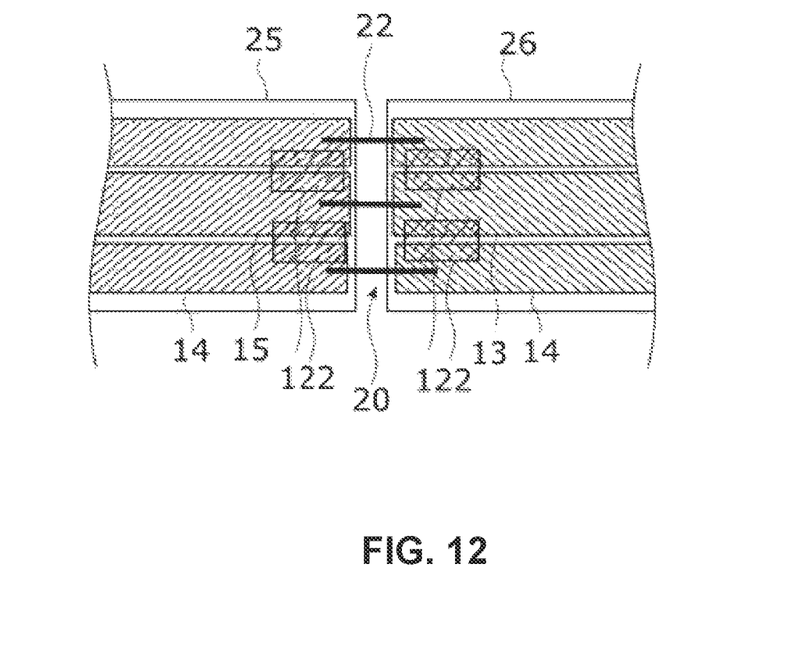
FIG. 12 illustrates a capacitive structural feature of the present invention.
Figure 13:
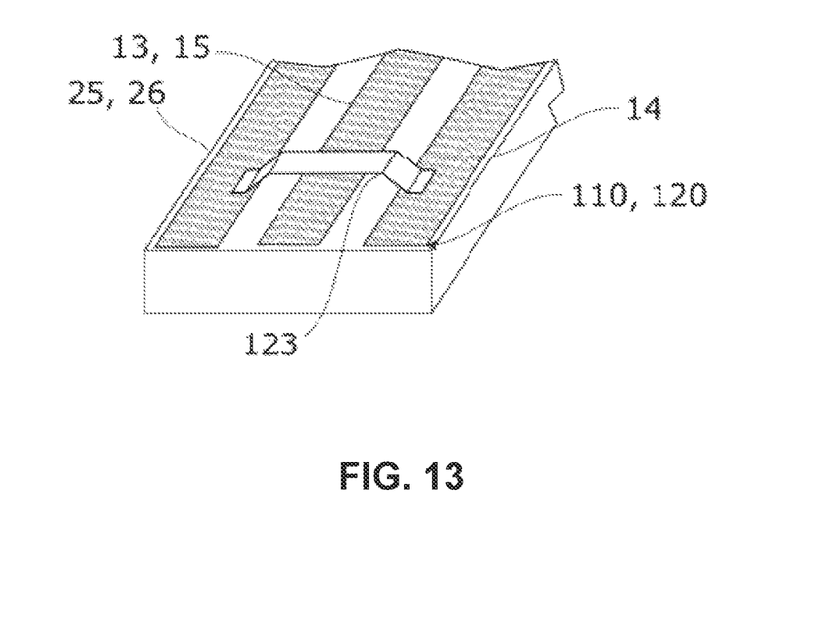
FIG. 13 illustrates another capacitive structural feature of the present invention.

Capacitive structural features 111, 121 are important for improving the radio frequency properties of header 1. As already mentioned above, capacitive structural features 111, 121 may also be designed differently from the special embodiment of the illustrated trapezoidal enlarged portion of signal conductors 13, 15. FIGS. 12 and 13 show further embodiments of capacitive structural features 111, 121. The embodiment according to FIG. 12 is based on increasing the capacitance at gap 20 by a dielectric body 122. Accordingly, the capacitive structural feature may include a dielectric body. For example, a dielectric coating may be applied to the gap-side end of conductor track arrangement 11, 12. The capacitance can be effectively increased in particular by having the dielectric coating or, more generally, dielectric body 122 covering spacing 17 between grounding conductor 14 and the respective signal conductor 13, 15, as illustrated. Dielectric bodies 122 may be provided so as to overlap spacing 17 and, as illustrated, leave a portion of signal conductor 13, 15 exposed for attaching the bonding wires. It is also conceivable to apply dielectric body 122 after the bonding connection has been produced and, in doing so, to embed the contact point of the conductor track and the bonding wire, for example.

According to yet another embodiment, for which an example is schematically shown in FIG. 13, the capacitive structural feature may include a conductive bridge 123. To illustrate this, FIG. 13 shows a perspective view of submount 25 or circuit board 26 with the respective conductor track arrangements 11, 12 with their ends 110, 120 facing the gap. In the vicinity of the end of the conductor track arrangement 11, 12, a bridge 123 may be provided, which spans signal conductor 13 or 15 and is connected to grounding conductors 14. This bridge 123 defines a small capacitor.

The different embodiments of capacitive structural features may also be combined with one another. For example, bridge 123 might be implemented as a conductive coating over a dielectric coating. Also, these structural features may be provided in addition to an enlarged portion of the signal conductor. Furthermore, besides a trapezoidal shape, the enlarged portion may have various alternative shapes, such as round or rectangular heads or portions only enlarged to one side, for example in the form of flags.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

REFERENCE NUMERALS

1 Header
2 Electronic device
3 Base body of 1
4 Feedthrough
5 Package
6 Insulation material
7 Opening
8 Feedthrough conductor
9 Pedestal
10 Electronic component
11,12 Conductor track arrangement
13, 15 Signal conductor
14 Grounding conductor
16 Thermoelectric cooler
17 Spacing between 14 and 13, 15
18 Carrier
20 Gap
22, 23 Bonding wire connection
25 Submount
26 Circuit board
27 Temperature sensor
28 Monitoring diode
50 Cap
51 Window
110, 120 Ends of 11, 12
111, 121 Capacitive structural feature
122 Dielectric body
141 Back-side electrode
142 Via
261, 262 Side edges of 26

What is claimed is:

1. A header for an electronic component, comprising:
a base body having a plurality of electrical feedthroughs, the feedthroughs each having an opening that is sealed by an insulating material through which at least one feedthrough conductor extends, the at least one feedthrough conductor being electrically insulated from the base body;
a thermoelectric cooler attached to the base body, the thermoelectric cooler being thermally attached to the base body with waste heat generated by the thermoelectric cooler during operation being conducted to the base body;
a carrier for an electronic device coupled to the thermoelectric cooler, the carrier being cooled by the thermoelectric cooler;
a first conductor track arrangement including:
a first signal conductor connected to the feedthrough conductor; and
at least one grounding conductor; and
a second conductor track arrangement on the carrier, the second conductor track arrangement being connectable to the electronic device and, the second conductor track arrangement including:
a second signal conductor; and
at least one grounding conductor, the first and second conductor track arrangements being separated by a gap, the gap being bridged by bonding wire connections electrically connecting the first signal conductor to the second signal conductor and electrically connecting the two grounding conductors, the first and second conductor track arrangements each having an end, the ends facing each other, at least one of the ends of the first and second conductor track arrangements facing each other at the gap having a capacitive structural feature that adds electrical capacitance per unit length of the first and/or the second conductor track arrangement in an area of the capacitive structural feature,
wherein the capacitive structural feature includes at least one of an enlarged portion of the first and/or the second signal conductor at the ends of the conductor track arrangement, a dielectric body, a conductive bridge, and a reduced spacing between the grounding conductor and the signal conductor at the end of the first and/or the second conductor track arrangement.

2. The header of claim 1, wherein the enlarged portion has a trapezoidal shape, the first and/or the second signal conductor widens by at least a factor of 1.5, the width of spacing between the grounding conductor and the signal conductor of the first and/or second conductor track arrangements changes by a factor of no more than 1.5 in the vicinity of the enlarged portion with the width being measured perpendicular to the longitudinal extension of the first or the second signal conductor, and the impedance increases by less than 5 ohms in the area between the capacitive structural features.

3. The header of claim 1, wherein the first and/or the second conductor track arrangements is a coplanar waveguide.

4. The header of claim 1, wherein the ends of the conductor track arrangements have capacitive structural features that include at least one of:
the capacitive structural features having a ratio of capacitances in a range from 0.5 to 2;
the capacitive features and the bonding wire connections have an impedance in a range from 20 Ohms to 80 Ohms;
a ratio $L1/(C1+C2)$ has a value in a range of 1000 Ohm$^2$ to 5000 Ohm$^2$ where C1 and C2 denote the capacitances of the capacitive structural features on each of the ends of the conductor track arrangements and L1 denotes an inductance of the bonding wire connections.

5. The header of claim 1, wherein the electronic device is mounted on a submount which includes the second conductor track arrangement.

6. The header of claim 1, further comprising a pedestal on which the first conductor track arrangement is disposed, the pedestal being separated from the carrier for the electronic device by the gap.

7. The header of claim 6, further comprising a circuit board, the first conductor track arrangement being disposed on the circuit board, the circuit board being mounted to the pedestal.

8. The header of claim 7, further comprising at least one of a back-side electrode in the form of a conductive layer disposed on a side of the printed circuit board opposite the first conductor track arrangement with the at least one grounding conductor of the first conductor track arrangement connected to the back-side electrode through at least one conductive connections, the at least one grounding conductor being electrically connected to the pedestal, the signal conductor of the first conductor track arrangement changing its course by at least 45° from a direction collinear with the feedthrough conductor to which the first signal conductor is connected to a direction towards the electronic device, and the circuit board having two opposite end edges and two opposite side edges adjoining thereto with one of the end edges facing the base body and the gap being defined along one of the side edges.

9. The header of claim 1, wherein the electronic device is an electro-optical converter in the form of a laser diode.

10. The header of claim 1, further comprising at least one of the following features:
- the at least one grounding conductor of the first conductor track arrangement extending beyond the center of a solder connection of the feedthrough conductor to the first signal line as seen opposite to the direction of the first signal line;
- the gap having a width of at least 0.1 mm;
- the spacing between the opposing conductor tracks of the two conductor track arrangements to be connected being at least 0.12 mm;
- the bonding wire of the bonding wire connections having a length of at least 0.2 mm; and
- the bonding wire of the bonding wire connections having an inductance in the range of 50 pH to 800 pH.

11. An electronic component, comprising a package, and a header as claimed in claim 1, the package being coupled to the header.

* * * * *

UNITED STATES PATENT AND TRADEMARK OFFICE
CERTIFICATE OF CORRECTION

| | | |
|---|---|---|
| PATENT NO. | : 12,009,634 B2 | Page 1 of 1 |
| APPLICATION NO. | : 17/190860 | |
| DATED | : June 11, 2024 | |
| INVENTOR(S) | : Andreas Krause et al. | |

It is certified that error appears in the above-identified patent and that said Letters Patent is hereby corrected as shown below:

In the Specification

Column 9
At Lines 4 and 5, please delete "spacing w 3", and substitute therefore --spacing $w_3$--.

Signed and Sealed this
Twenty-third Day of December, 2025

John A. Squires
*Director of the United States Patent and Trademark Office*